ULTRA HIGH FREQUENCY TRANSISTOR OSCILLATOR

Filed Nov. 15, 1963 2 Sheets-Sheet 1

INVENTOR
LEOPOLD A. HARWOOD
By Eugene M. Whitacre
Attorney

ULTRA HIGH FREQUENCY TRANSISTOR OSCILLATOR

INVENTOR.
LEOPOLD A. HARWOOD

BY Eugene M. Whitacre

Attorney

United States Patent Office 3,270,292
Patented August 30, 1966

3,270,292
ULTRA HIGH FREQUENCY TRANSISTOR OSCILLATOR

Leopold A. Harwood, Cherry Hill, N.J., assignor to Radio Corporation of America, a corporation of Delaware Filed Nov. 15, 1963, Ser. No. 324,023
9 Claims. (Cl. 331—97)

This invention relates in general to oscillator circuits and in more particular to ultra high frequency (UHF) oscillator circuits.

A problem encountered in UHF transistor oscillator circuits is the frequency drift as a consequence of variations of either line voltage or ambient temperature or both. Transistors are voltage and temperature senstive, i.e., the parameters of transistors such as output capacitance and output conductance, for example, vary with changes of voltage or temperature or both. Thus, the variation in the parameters of the transistor in an oscillator circuit causes a change of the characteristic of the frequency determining network which results in frequency drift. The frequency drift of the oscillator circuit may be reduced if the frequency determining network is made less sensitive to the change of the parameters of the transistors, such as by loosely coupling the transistor and the frequency determining network, for example, while still permitting enough energy to sustain oscillations to be coupled between the transistor and the frequency determining network.

In UHF oscillator circuits having a wide frequency range of operation, such as oscillator circuits operable throughout the UHF television band for example, loosely coupling the transistor and the frequency determining network does not, by itself, solve the problems of spurious oscillations of the oscillator circuit, nor the problem of having an oscillator circuit in which the output power at some frequencies within the desired frequency range is below the desired value.

Accordingly, it is an object of this invention to provide an UHF oscillator circuit having improved frequency stability with variations of line voltage and ambient temperature.

It is another object of this invention to provide an improved UHF oscillator circuit which does not oscillate at frequencies outside the desired frequency range, i.e., parasitic oscillations.

It is still another object of this invention to provide an UHF oscillator circuit having substantially constant output power throughout the UHF television band.

An UHF oscillator circuit embodying the invention includes a transistor as the active element of the oscillator circuit. The frequency determining network of the oscillator circuit includes a transmission line and a tuning capacitor connected at one end of the transmission line. The variable capacitor tunes the transmission line to a desired frequency within a desired frequency range. A second capacitor is connected at the other end of the line to determine, in conjunction with the maximum capacitance exhibited by the variable capacitor, the minimum frequency of operation of the oscillator circuit. The second capacitor is such that it adjusts the lower frequency range of the oscillator circuit without introducing undesired resonances in the oscillator circuit. The transmission line and the collector electrode of the transistor are coupled by circuit means which exhibit a large impedance relative to the output impedance of the transistor so that the effect produced in the frequency determining network by changes in the parameters of the transistor (due to a change in line voltage or a change in the ambient temperature) is within a predetermined value, while oscillations at a desired frequency providing a predetermined energy output are maintained.

The novel features which are considered to be characteristic of the invention are set forth in particularity in the appended claims. The invention itself, however, both as to its organization and method of operation as well as additional objects and advantages thereof will best be understood from the accompanying drawing in which:

Figure 4:
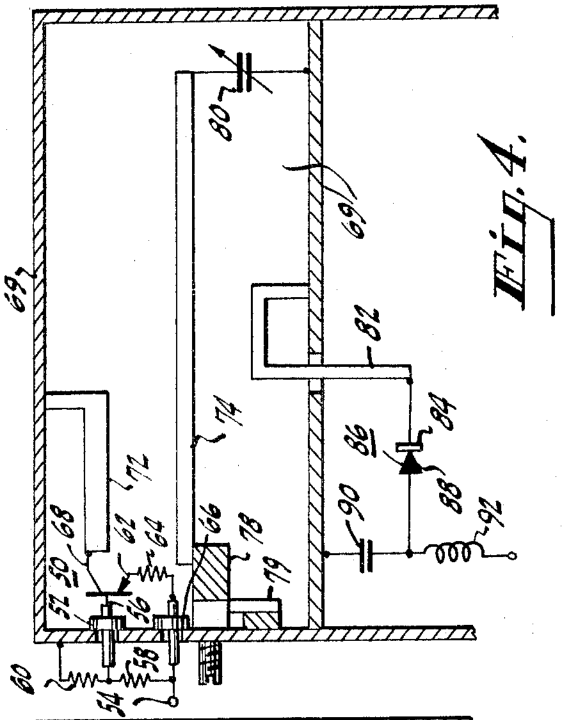
FIGURE 4 is a diagrammatic schematic circuit diagram of a portion of a UHF tuner for a superheterodyne receiver including separate oscillator and mixer circuits embodying the invention.
Figure 6:
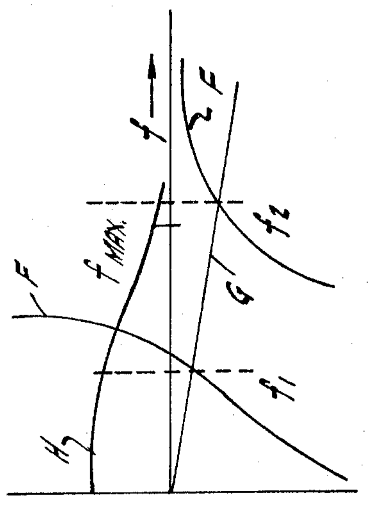
Figure 5:
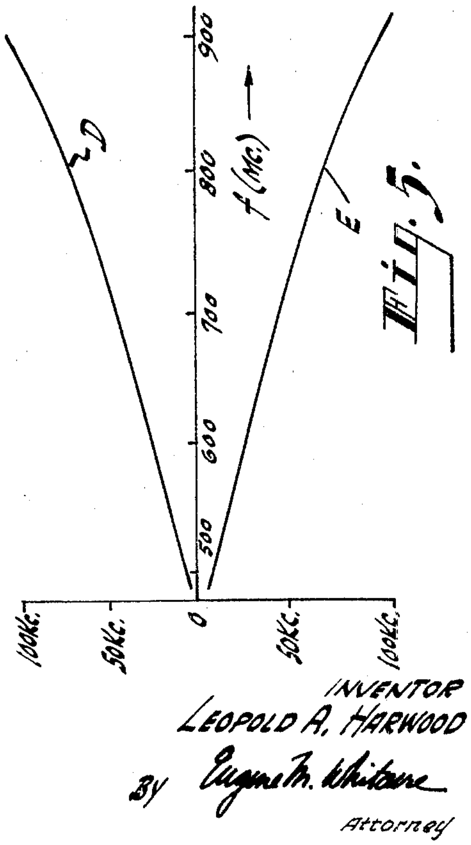

FIGURE 5 is a graph illustrating the frequency drift of the oscillator circuit shown in FIGURE 4, as a function of the frequency of oscillation for a ±10% change in the operating voltage; and FIGURE 6 is a graph illustrating the conditions for oscillation of the circuit shown in FIGURE 4 including the reflected admittance characteristic of the resonant circuit as a function of frequency, the susceptance characteristic of the output capacitance of the transistor as a function of frequency, and the transconductance characteristic of the transistor as a function of frequency.

Figure 1:
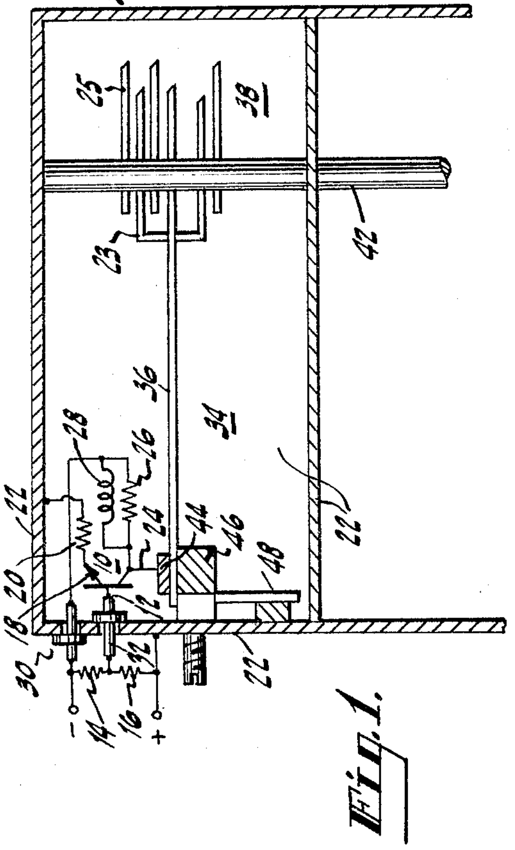
FIGURE 1 is a diagrammatic schematic circuit diagram of an UHF oscillator circuit embodying one form of the invention.

Reference is now made to FIGURE 1 which is a diagrammatic schematic circuit diagram of an UHF oscillator circuit included in an UHF tuner which may be used in a superheterodyne receiver for example. The UHF oscillator circuit shown in FIGURE 1 may be, for example, an oscillator circuit whose operation extends throughout the UHF television band (470 to 890 megacycles). The oscillator circuit includes a transistor 10 which is connected as the active element of the oscillator circuit. The base electrode 12 is coupled to a source of operating potential, not shown, through a resistor 14. The resistor 14 forms with the resistor 16 a voltage divider network that biases the base electrode 12 to a desired potential with respect to the potential in the emitter electrode 18. The emitter electrode 18 is connected through a resistor 20 to a point of fixed reference potential provided in this case by a conductive chassis 22 which forms the local oscillator compartment. The resistor 16 is also connected to the chassis 22.

The collector electrode 24 of the transistor 10 is connected to the source of operating potential previously mentioned, through a parallel circuit which includes an inductor 28 and a resistor 26. The inductor 28 is a radio frequency choke which provides a large alternating current (A.-C.) impedance and a small direct current (D.-C.) resistance to the collector circuit of the transistor 10. The large A.-C. impedance permits the oscillation to have the desired amplitude. However, the inductance of the inductor 28 in conjunction with the intrinsic capacitance of the transistor 10 and with the intrinsic capacitance of the circuit resonates at a frequency other than the desired frequency of operation. The spurious oscillation caused by the inductance of the inductor 28, however, is damped by the resistor 26, which has a small value of resistance. The feedthrough capacitor 30 provides a low impedance path for signals at the oscillator frequency. The base electrode 12 is bypassed at signal frequencies by means of a feedthrough capacitor 32, connected between the base electrode 12 and the voltage divider network, to provide a common base oscillator circuit. The desired bias voltage is applied to the base electrode 12 by means of the center conductor of the feedthrough capacitor 32.

The frequency of operation of the oscillator circuit is determined by a transmission line comprising an inner conductor 36 and an outer conductor formed by the conductive chassis 22. A variable tuning capacitor 38 is connected between one end of the transmission line conductor 36 and the conductive chassis 22.

The capacitor 38, may be, for example, a parallel plate type tuning capacitor having fixed stator plates 23 and rotatable rotor plates 25. The set of stator plates 23 forms an integrated part with the transmission line conductor 36. The shaft 42 which is connected to the conductive chassis 22 supports the rotor plates 25 of the capacitor 38, and is rotatable to change the relative positions of the rotor plates 25 with respect to the stator plates and thereby vary the capacitance of the capacitor 38.

The collector electrode 24 is coupled to the other end of the transmission line conductor 36 through a capacitor 44 which may be a disc type capacitor and which has a small value of capacitance, such as 2 picofarads for example, to provide coupling between the transistor and the frequency determining network. The coupling provided by the capacitor 44 between the transmission line and the collector electrode circuit of the transistor 10 is such that the output impedance of the transistor 10 is loosely coupled to the frequency determining network, (the coupling capacitor 44 presents a high reactance at signals frequencies), so that changes in the output impedance of the transistor cause a relatively small effect on the frequency determining network of the oscillator circuit whereby the frequency drift of the oscillator is minimized.

A trimmer capacitor 46 is connected between the transmission line conductor 36 and the chassis 22. The capacitor 46 is utilized to adjust the lower frequency end of the oscillator's frequency band of operation to the minimum frequency desired. The capacitor 46 includes a stator electrode with an extension plate 48 extending parallel to the chassis 22 to provide a low inductance capacitance. The total inductance of the capacitor 46 and extension plate 48 is small enough that the frequency of resonance of the path extending from the collector electrode 24 to the chassis through the coupling capacitor 44 and the trimmer capacitor 46 is well above the cut-off frequency of the transistor. If the trimmer capacitor 44 exhibits substantial inductance, it has been found that the coupling capacitor 44 may resonate with this inductance at a frequency below the cut-off frequency of the transistor, and lock the oscillator to a frequency determined by these elements so that variations of the tuning capacitor then do not materially effect the frequency of operation of the circuit.

Figure 2:
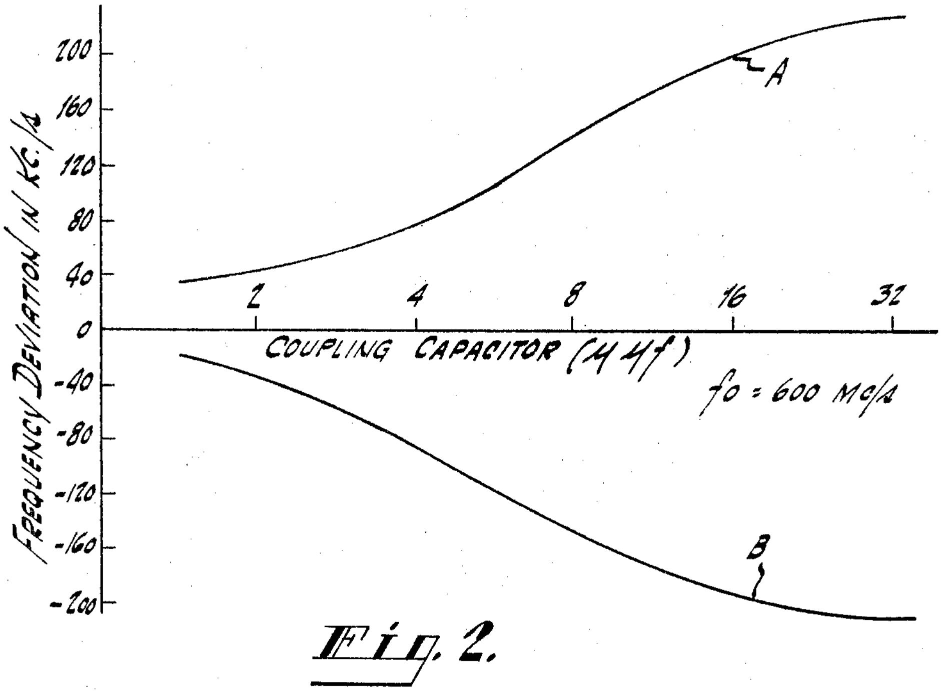
FIGURE 2 is a graph illustrating the frequency drift of the oscillator circuit shown in FIGURE 1 as a function of the magnitude of the coupling capacitor, for a ±10% change in the operating voltage at a frequency of oscillation of 600 megacycles per second.

Reference is now made to FIGURE 2, which is a graph showing the frequency deviation in kilocycles per second as a function of the magnitude of the coupling capacitor 44 in micro-micro-farads for a ±10% change in the operating voltage; the frequency of operation of the oscillator circuit being equal to 600 megacycles per second.

The curve A represents a 10% increase in the operating voltage, and the curve B represents a 10% decrease in the operating voltage. As indicated by FIGURE 2, curves A and B are substantially symmetrical. Also, as indicated in FIGURE 2, the frequency deviation of the oscillator circuit increases as the magnitude of the coupling capacitor 44 increases. At a value of the coupling capacitor 44 of approximately two picofarads, the frequency change, for a change in operating voltage of ±10%, is approximately 60 kc. At a value of the coupling capacitor 44 equal to eight picofarads a voltage change of ±10% produces a frequency change of 160 kc. When the value of the coupling capacitor 44 is equal to sixteen picofarads, the frequency change is approximately 400 kc.

Figure 3:
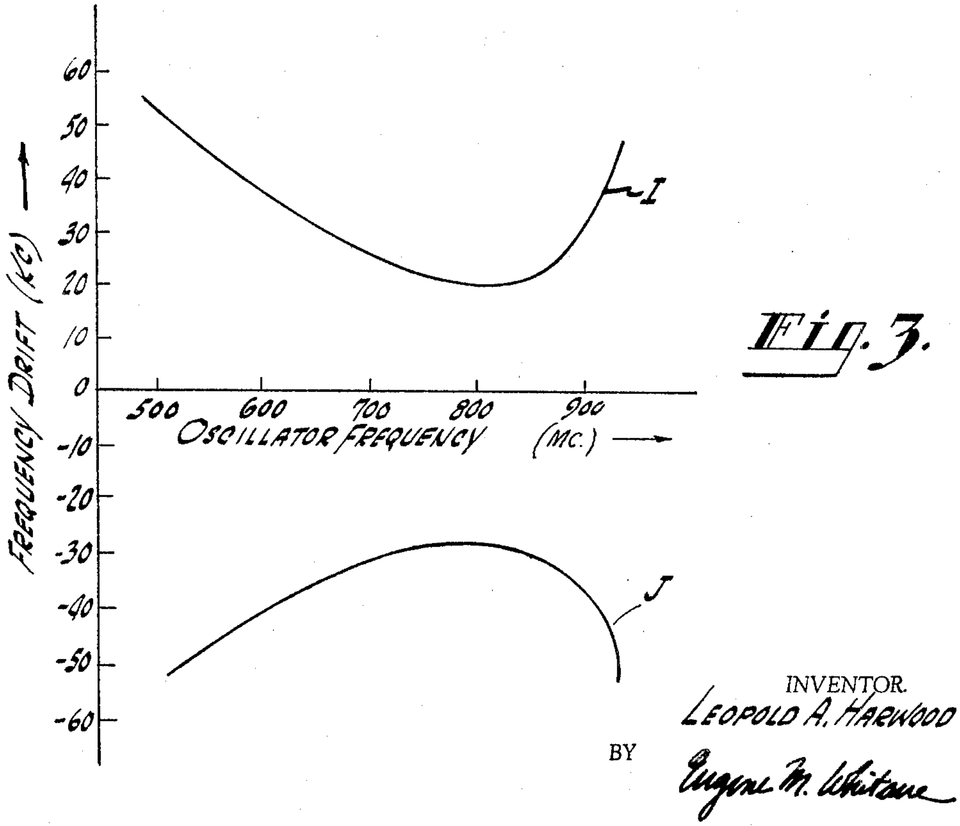
FIGURE 3 is a graph illustrating the frequency drift of the oscillator circuit shown in FIGURE 1 as a function of the frequency of oscillation for a ±10% change in the operation voltage.

Reference is now made to FIGURE 3 of the drawing, which is a graph illustrating the frequency drift of the oscillator circuit shown in FIGURE 1, as a function of the frequency of oscillation, for ±10% change in the operating voltage. The coupling capacitor 44 employed had a value of 2 micromicrofarads. The curve I represents a 10% increase in the operating voltage, and the curve J represents a 10% decrease in the operating voltage. As shown in FIGURE 3, curves I and J are substantially symmetrical, and the frequency deviation (50 kilocycles) is a minimum at a frequency equal to approximately 800 megacycles per second. At around 500 megacycles and 900 megacycles the frequency deviation is about 100 kilocycles per second and this represents the maximum frequency drift of the oscillator circuit operable throughout the UHF television band.

Another embodiment in accordance with the invention is shown in FIGURE 4 of the drawings. The oscillator circuit shown in FIGURE 4 utilizes inductive coupling in such a manner as to provide the same advantages as those described in connection with the circuit shown in FIGURE 1. A transistor 50 is connected as the active element of the oscillator circuit. The base electrode 56 is bypassed at signal frequencies by the feedthrough capacitor 52 to provide a common base oscillator type circuit. A source of operating potential, not shown, is applied to the terminal 54. The base electrode 56 is biased to a desired potential by means of a voltage divider network comprising resistors 58 and 60 connected in series between the terminal 54 and the conductive chassis 69, which forms the oscillator compartment. The center conductor of the capacitor 52 applies the desired bias voltage from the voltage divider network to the base electrode 56 of the transistor 50.

The emitter electrode 62 is connected through a resistor 64 to the terminal 54, which is bypassed at signal frequencies by the feedthrough capacitor 66. The collector electrode 68 is connected to the chassis 69 through a coupling link 72. The frequency determining network of the oscillator circuit includes a coaxial transmission line, comprising a transmission line conductor 74 and the conductive chassis 69.

A capacitor 80 is a variable tuning capacitor which may be similar to the variable capacitor 38 described in connection with FIGURE 1 of the drawings. The capacitor 78 is a trimmer capacitor similar to the capacitor 46 described in connection with the circuit shown in FIGURE 1. In addition, the required low inductance capacitance to determine the minimum frequency of operation is provided by an extension plate 79 which may be similar to the low inductance capacitor 46, shown in FIGURE 1.

The collector circuit of the transistor 50 is inductively coupled to the transmission line by the coupling link 72 previously described. By inductively coupling the tank circuit to the collector circuit loose coupling of the frequency determining network and the transistor 50 is effected. As previously described, the frequency drift of the oscillator circuit due to changes in the transistor parameters (due to changes in the source of operating potential and ambient temperature) is minimized by loose coupling. The frequency deviation in kilocycles as a function of ±10% change in operating voltage throughout the UHF television band of operation of the oscillator circuit of FIGURE 4 is shown in FIGURE 5.

In FIGURE 5, curve D represents a 10% increase in the operating voltage, and curve E represents a 10% decrease in the operating voltage. As shown in FIGURE 5, curves D and E are substantially symmetrical, and the frequency deviation increases as a function of the operating frequency; the deviation being a maximum at the maximum operating frequency. If the oscillator circuit is employed as an UHF oscillator tunable over the UHF television band, the maximum frequency deviation at 890 mc. is approximately 200 kc.

FIGURE 6 illustrates the required conditions for oscillation. The curve F illustrates the susceptance characteristic seen by the transistor circuit as a function of frequency, the curve G represents the negative of the susceptance characteristic of the output capacitance of the transistor circuit, and the curve H represents the transconductance ($g_m$) characteristic of the transistor 50. The condition for oscillation is that the total susceptance of the circuit must equal zero. The points of zero susceptance, the intersections of curves F and G occur at the frequencies $f_1$ and $f_2$. The oscillator circuit, however, will oscillate only at the frequency $f_1$ because as illustrated by the curve H, the necessary value of transconductance to sustain oscillations is a minimum at $f_{max}$. At frequencies higher than $f_{max}$ the value of $g_m$ is too small to sustain oscillations.

The output energy from the oscillator circuit of FIGURE 4 may be coupled from the oscillator's tank circuit to a mixer circuit, for example, by means of a coupling link 82 connected between the cathode electrode 84, of the diode 86, and ground (the wall 69 of the oscillator compartment). The anode electrode 88 is connected to a series circuit including a capacitor 90 and an inductor 92. The capacitor 90 is connected between the wall 69 and the anode electrode 88. Intermediate frequency signals are derived from the diode 86 through the inductor 92. The capacitor 90 and the inductor 92 form a low pass filter to attenuate signal frequencies.

One of the advantages obtained with the circuit shown in FIGURE 4 is that the power output provided by the circuit is substantially constant. Because the coupling between the transistor and the frequency determining network increases as the frequency of operation is increased simultaneously with a decrease of transconductance of the transistor also as a function of frequency, the constant power output characteristic of the circuit is obtained.

The increase in signal coupling as a function of frequency, i.e., more energy is coupled at higher frequencies, is effected because the self resonating frequency of the transistor output capacitance and the loop coupling (approximately 1500 mc.), is fixed at a frequency higher than the maximum frequency of operation (approximately 1000 mc). Therefore as the operating frequency is increased, the frequency of resonance of both the transistor circuit and the frequency determining network are closer to each other, which results in a higher signal coupling.

What is claimed is:

1. A tunable ultra high frequency oscillator circuit comprising:

a conductive chassis providing an enclosure for said oscillator circuit;

a transistor having first, second and third electrodes;

a resonant circuit including a tunable transmission line having a transmission line conductor supported in said enclosure, said conductor having a main body portion and having one end portion spaced from said chassis but extending closer to said chassis than said main body portion;

a first capacitor coupled between said one end portion of said conductor and the first electrode of said transistor, said capacitor exhibiting relatively large capacitance reactance at ultra high frequencies for coupling substantially the minimum energy to sustain oscillations of predetermined strength in said resonant circuit over a range of frequencies to be tuned by said tunable transmission line;

means coupling the second electrode of said transistor to said chassis;

means regeneratively coupling the third and first electrodes of said transistor, and a second capacitor coupled between said one end of said transmission line conductor and the adjacent portion of said chassis, the combination of said second capacitor and said one end portion providing a resultant capacitance having an inductance value sufficiently small so that the circuit loop including said transistor and said first and second capacitors is resonant above the cutoff frequency of said transistor.

2. A tunable ultra high frequency oscillator circuit as defined in claim 1 in which said first capacitor coupled between said one end portion of said conductor and the first electrode of said transistor is of the order of two micromicrofarads.

3. An ultra high frequency oscillator circuit comprising in combination:

a transistor having base, emitter and collector electrodes;

a frequency determining network including a tunable transmission line having first and second transmission line conductors;

means for connecting said base, emitter, and collector electrodes of said transistor to cooperate with said frequency determining network to establish self oscillation in said circuit, said means including means connected between said transistor collector electrode and said frequency determining network for coupling sufficient energy between said frequency determining network and said transistor to sustain oscillations, said coupling means exhibiting an impedance at said ultra high frequencies which is large relative to the output impedance of said transistor whereby variations in the output impedance of said transistor are substantially isolated from said frequency determining network; and a capacitor coupled across one end of said transmission line to adjust the minimum frequency of oscillation of said oscillator circuit, the combination of said capacitor and said one end of said transmission line providing a low inductance capacitor having an inductance value sufficiently small to prevent oscillation at frequencies not primarily determined by said frequency determining network.

4. An ultra high frequency oscillator circuit as defined in claim 3 in which said means connected between said transistor collector electrode and said frequency determining network includes a capacitor having a capacity of the order of two micromicrofarads.

5. A tunable ultra high frequency oscillator circuit comprising in combination:

a chassis of conducting material providing a walled enclosure for said oscillator circuit;

a transistor having base, collector and emitter electrodes;

a resonant circuit including a tunable transmission line conductor supported in said enclosure, said conductor having a main body portion extending through said enclosure and having one end portion extending substantially parallel and significantly closer to but spaced from one of said enclosure wall than said main body portion;

inductive circuit means including a coupling link connected between said transistor collector electrode and said chassis for inductively coupling energy between said resonant circuit and said transistor; means interconnecting the base, collector and emitter electrode of said transistor and said chassis to establish self oscillation in said oscillator circuit, said inductive circuit means exhibiting an impedance at an operating frequency which is large as compared to the output impedance of said transistor so that the variations in said output impedance are substantially isolated from said resonant circuit whereby the frequency drift of said oscillator circuit caused by the change of said output impedance is kept within a predetermined value; and a low inductance capacitor coupled between said one end portion of said transmission line conductor and an adjacent wall of said enclosure.

6. An ultra high frequency oscillator circuit comprising in combination:

an enclosure for said oscillator circuit including conductive walls;

a conductor element having a main body portion supported in said enclosure and having one end portion spaced from but significantly closer to a wall of said enclosure than said main body portion;

a variable capacitor coupled between the other end of said conductor element and said enclosure for adjusting the frequency of resonance of a transmission line formed by said conductor element and said enclosure;

a transistor having first, second and third electrodes;

means coupling said first electrode of said transistor near said one end portion of said conductor element;

means connecting said second electrode to said enclosure;

means regeneratively coupling said first and third electrodes; and a capacitor coupled between said one end portion of said conductor element and an adjacent wall of said enclosure, the combination of said capacitor and said one end portion providing sufficiently small inductance that the circuit loop including said transistor and said capacitor is resonant above the cut-off frequency of said transistor.

7. An ultra high frequency oscillator circuit as defined in claim 6 wherein, said enclosure is rectangular in cross section and the main body of said conductor element extends through said enclosure substantially parallel to its major axis, and said one end portion extends substantially perpendicular to said major axis.

8. An ultra high frequency oscillator circuit comprising in combination:

a conductive chassis;

a transistor having base, emitter, and collector electrodes;

a frequency determining network including a transmission line conductor supported in said chassis and a variable tuning capacitor connected between one end of the transmission line conductor and said chassis;

means for connecting said base, emitter, and collector electrodes of said transistor to cooperate with said frequency determining network to provide oscillations, said means including a first capacitor connected between said transistor collector electrode and the other end of said transmission line conductor for coupling sufficient energy between said frequency determining network and said transistor to sustain oscillations, said first capacitor exhibiting an impedance at ultra high frequencies relative to the output impedance of said transistor whereby variations in the output impedance of said transistor will be substantially isolated from said frequency determining network; and a second capacitor connected between said other end of said transmission line conductor and said chassis for adjusting the minimum frequency of oscillation of said oscillator circuit, said second capacitor exhibiting sufficiently low inductance in combination with said other end portion of said transmission line conductor so that the frequency of resonance of the path extending from the collector electrode of said transistor to said chassis through said first and second capacitors is above the cut-off frequency of the transistor.

9. An ultra high frequency oscillator circuit comprising in combination:

an enclosure for said oscillator circuit including conductive walls;

a conductor element having a main body portion supported in said enclosure and having one end portion spaced from but significantly closer to a conductive wall than said main body portion;

tuning means coupled between the other end of said conductor element and said enclosure;

a transistor having base, emitter, and collector electrodes;

means coupling the collector electrode of said transistor near said one end portion of said conductor element;

means coupling said base electrode to said enclosure for ultra high frequency oscillations;

means for applying an operating potential between said collector and emitter electrodes of said transistor; and a capacitor coupled between said one end portion of said conductor element and an adjacent wall of said enclosure.

References Cited by the Examiner

UNITED STATES PATENTS

| | | | |
|---|---|---|---|
| 2,121,158 | 6/1938 | Lindenblad | 331—102 |
| 2,530,995 | 11/1950 | Rumpf | 331—97 X |
| 3,140,444 | 7/1964 | Carlson | 331—97 X |

ROY LAKE, *Primary Examiner.*

S. H. GRIMM, *Assistant Examiner.*